US006893091B1

(12) United States Patent  (10) Patent No.: US 6,893,091 B1
Fenner  (45) Date of Patent: May 17, 2005

(54) SIDE-VENTED ENCLOSURE AND TELESCOPING RAIL SYSTEM

(76) Inventor: Martin Fenner, 2000 Industrial Blvd., Stillwater, MN (US) 55082

( * ) Notice: Subject to any disclaimer, the term of this patent is extended or adjusted under 35 U.S.C. 154(b) by 0 days.

(21) Appl. No.: 10/414,906

(22) Filed: Apr. 16, 2003

Related U.S. Application Data

(60) Provisional application No. 60/378,324, filed on May 7, 2002.

(51) Int. Cl.[7] .............................................. A47B 88/00
(52) U.S. Cl. ................................ 297/334.8; 312/334.5
(58) Field of Search ............................ 312/223.2, 351, 312/350, 330.1, 334.7, 334.8, 334.1, 334.4, 312/334.5, 333, 349, 236; 211/26, 118

(56) References Cited

U.S. PATENT DOCUMENTS

| | | | | |
|---|---|---|---|---|
| 4,370,007 A | * | 1/1983 | Fler | 312/334.1 |
| 4,681,381 A | * | 7/1987 | Sevey | 312/333 |
| 4,998,828 A | | 3/1991 | Hobbs | 384/18 |
| 5,211,461 A | * | 5/1993 | Teufel et al. | 312/334.4 |
| 5,405,195 A | | 4/1995 | Hobbs | 312/334.46 |
| 5,417,490 A | | 5/1995 | Hobbs et al. | 312/334.47 |
| 5,419,639 A | | 5/1995 | Hobbs et al. | 384/18 |
| 5,460,441 A | * | 10/1995 | Hastings et al. | 312/298 |
| 5,466,060 A | * | 11/1995 | Hoffman | 312/334.8 |
| 5,785,401 A | * | 7/1998 | Bowyer et al. | 312/350 |
| 6,209,979 B1 | | 4/2001 | Fall et al. | 312/330.1 |
| 6,297,962 B1 | * | 10/2001 | Johnson et al. | 361/726 |
| 6,424,534 B1 | * | 7/2002 | Mayer et al. | 361/724 |
| 2001/0037985 A1 | * | 11/2001 | Varghese et al. | 211/26 |

* cited by examiner

*Primary Examiner*—Peter M. Cuomo
*Assistant Examiner*—Stephen Vu
(74) *Attorney, Agent, or Firm*—Kinney & Lange, P.A.

(57) ABSTRACT

A storage system is used for storing electrical equipment. The system includes a cabinet with storage racks vertically stacked within the cabinet. Each rack is comprised of a box having a back wall, a front wall, first and second side walls, and top and bottom walls, wherein the first and second side walls define a height of the rack. The storage racks are slidably mounted to telescoping slides rails within the cabinet. Each side wall of the rack has at least one opening. A first slide rail assembly, having a first bracket and a first slide rail, attaches the first side wall of the rack to the cabinet. A second slide rail assembly, having a second bracket and a second slide rail, attaches the second side wall of the rack to the cabinet. The brackets of the slide rail assemblies are connected to and spaced apart from the side walls and the slide rails are connected to the rack side walls. The slide rails have at least one opening substantially aligned with the openings of the rack side walls. The first and second slide rails have a height substantially equal to the height of the rack. The openings of the first and second slide rails are aligned with the openings of the first and second side walls of the rack.

5 Claims, 6 Drawing Sheets

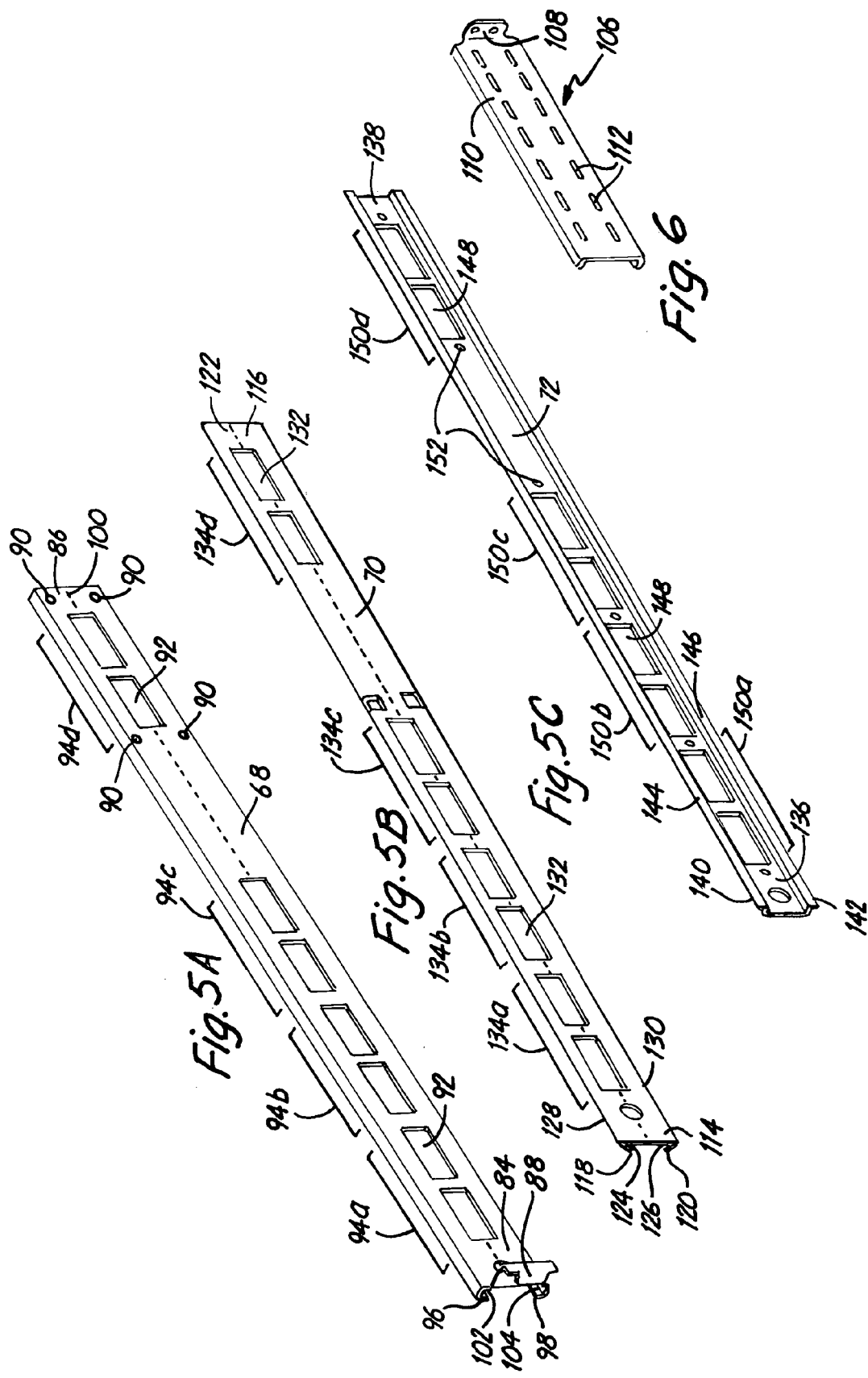

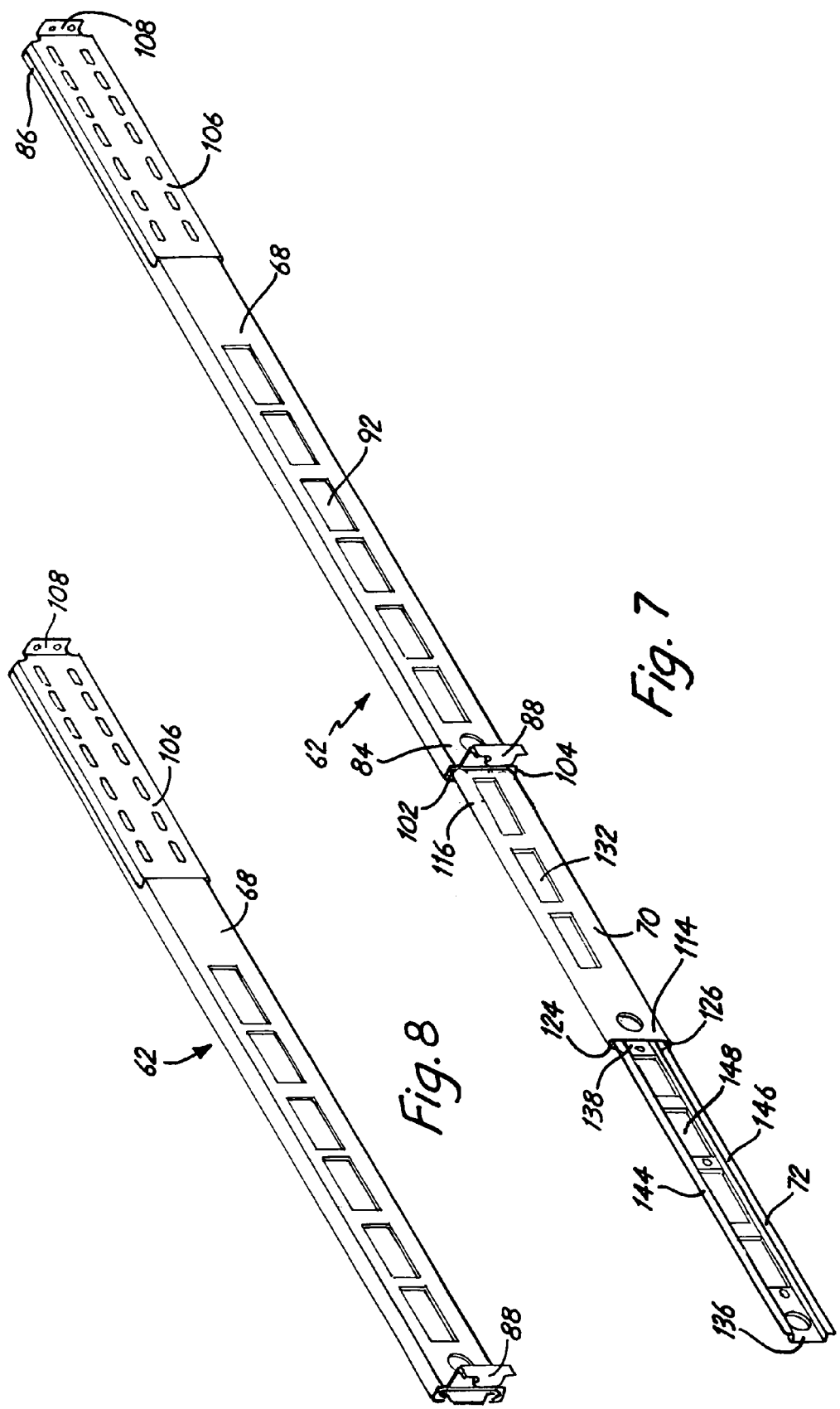

SIDE-VENTED ENCLOSURE AND TELESCOPING RAIL SYSTEM

CROSS-REFERENCE TO RELATED APPLICATION(S)

This application claims priority from provisional application No. 60/378,324 filed May 7, 2002, for "Side-Vented Enclosure and Telescoping Rail System" by Martin Fenner.

BACKGROUND OF THE INVENTION

The present invention is a storage system for storing electrical equipment in storage racks vertically stacked within a storage cabinet. In particular, the storage system includes side vented racks and rails to maintain acceptable temperatures within the storage racks.

Storage cabinets are generally used for storing a wide variety of electrical equipment, such as power supplies, central processing units (CPU), circuit boards, disc drives, tape drives, hard drives, storage arrays, controller card servers and exhaust fans. The equipment is generally stored in individual racks (i.e., storage containers or boxes) which are vertically stacked on top of each other within the cabinet. The racks are mounted to a pair of telescoping slide rails that are attached to the cabinet, which permits the rack to be extended out of the storage cabinet for repairs or modifications to the equipment in the rack. The slide rails mounted to the cabinet are vertically spaced such that a gap is formed between adjacent racks within the cabinet. This arrangement allows for sufficient airflow around the rack to dissipate heat generated by the electrical components in the rack.

Current model racks are comprised of substantially enclosed containers and therefore have limited means for venting the heat and maintaining the internal rack temperature at an acceptable level. One technique used to vent the racks is openings formed in a rear wall of the rack, and some racks include openings in the front wall as well. Air is circulated from the front to the rear of the rack to exit through openings in the rear of rack. The air should then exit through vents formed in the walls of the storage cabinet, most likely by a vacuum effect or blown out with a fan. The main problem of the current art, racks utilizing front to back circulation, is that there is poor circulation from front to back in the rack. Thus, gaps are required between adjacent racks vertically stored in the cabinet to ensure a proper temperature level in each rack.

A second technique for venting the racks involves using a rack having a height greater than a height of the slide rails to which it is attached. The height of storage racks and side rails are measured in "u" units where 1 u equals 1.75 inches. Where, for example, a rack having a 2 u height is mounted to slide rails having a 1 u height, the bottom half of the rack is attached to the slide rail, leaving the top half of the rack available for side venting. Air can thus be vented through side wall openings in the top half of the rack to maintain acceptable temperature levels in the storage racks. The requirement in the art to either vertically space adjacent racks in a cabinet or to utilize oversized racks relative to the rail height to control temperatures within the racks leads to inefficient use of storage space within the cabinet. Some businesses that store computer equipment or servers for other businesses (known as co-location services) charge a fee based on the rack space utilized within a cabinet. The ability to maximize utilization of space within a storage cabinet heretofore has been limited by the cooling requirements of prior art rack designs.

A storage system which allows close vertical stacking of storage racks and improved venting of the racks to maintain acceptable temperature levels within the racks is made possible by the present invention.

BRIEF SUMMARY OF THE INVENTION

The present invention relates to a storage system for storing electrical equipment. The storage system includes a cabinet having a first side wall, a second side wall and a front opening at a front face of the cabinet. Storage racks are vertically stacked within the cabinet. Each rack is comprised of a box that has a back wall, a front wall, first and second side walls, and top and bottom walls. The rack is slidably mounted to a pair of telescoping rails within the cabinet. Each side wall of the rack has at least one opening defined therethrough. The first and second side walls define a height of the rack. A first slide rail assembly, having a first bracket and a first slide rail, attaches the first side wall of the rack to the first side wall of the cabinet. The first bracket is connected to the cabinet and the first slide rail is connected to the first side wall of the rack. The first slide rail has at least one opening substantially aligned with the opening of the first side wall of the rack. A second slide rail assembly, having a second bracket and a second slide rail, attaches the second side wall of the rack to the cabinet. The second bracket of the second slide rail is connected to the cabinet and the second rail is connected to the second side wall of the rack. The second slide rail also has at least one opening substantially aligned with the opening of the second sidewall of the rack. The first and second slide rails have a height substantially equal to the height of the rack. The rack is slidable between a first position and a second position, such that in the first position, the rack is inside the cabinet and the first and second slide rails are retracted. In the second position, the rack is substantially outside the cabinet and the first and second slide rails are extended. In the first position, the openings of the rack and the openings of the first and second slide rails are aligned to allow air to be circulated across the electrical equipment and vented from the rack into the cabinet.

BRIEF DESCRIPTION OF THE DRAWINGS

FIGS. 5A–5C are perspective views of slide rail members.

FIG. 6 is a perspective view of a mounting bracket.

FIG. 7 is a perspective view of the slide rail in the extended position.

FIG. 8 is a perspective view the slide in the rail retracted position.

DETAILED DESCRIPTION

Figure 1:
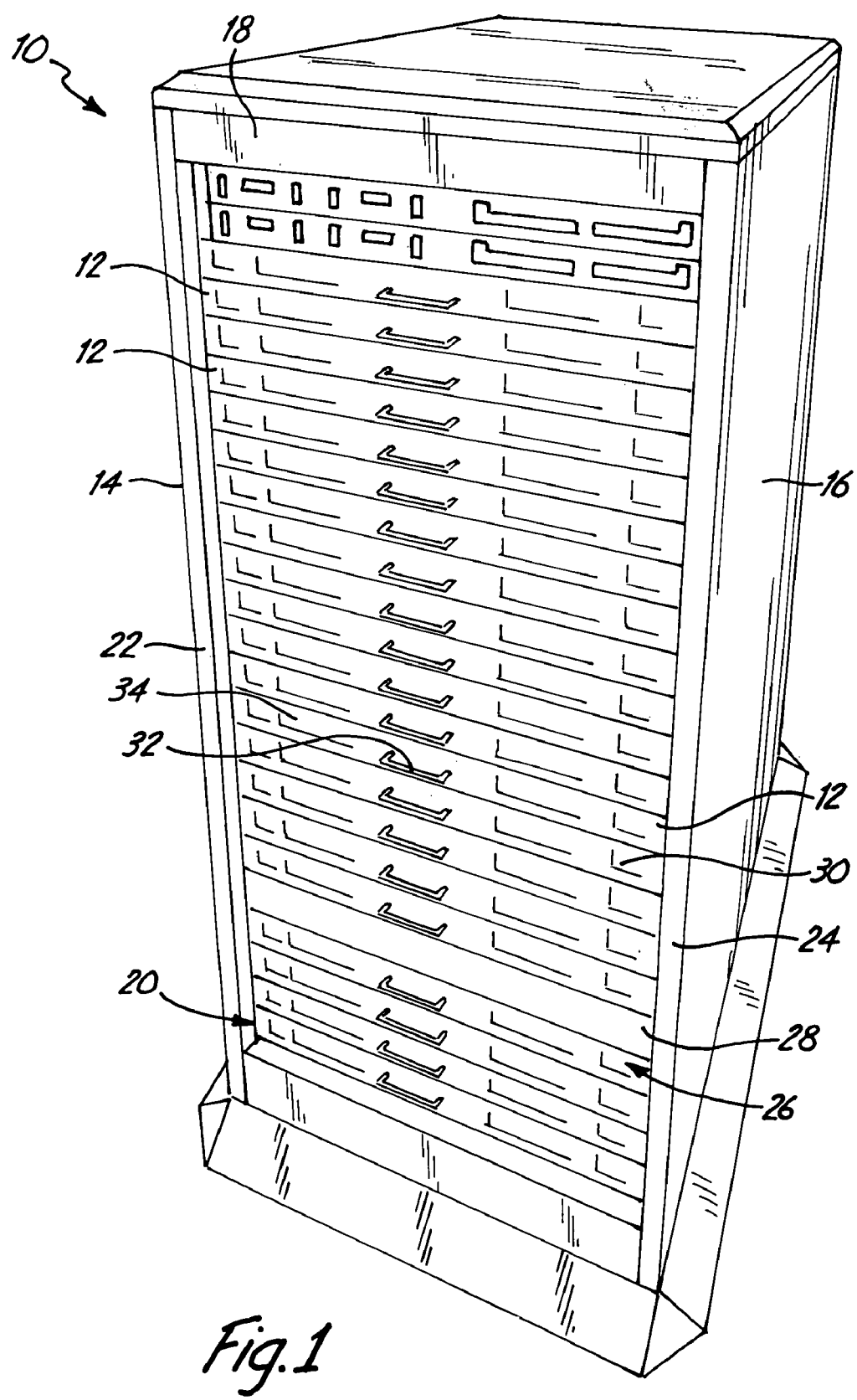
FIG. 1 is a front perspective view of a storage cabinet.

FIG. 1 is a front perspective view of a storage cabinet 10. Storage racks 12 are vertically stacked and mounted within the storage cabinet 10 and are used for storing electrical/computer components. The racks 12 are vertically stacked immediately adjacent each other, such that substantially no gap is formed therebetween, to maximize utilization of space within the cabinet 10. The racks 12 are slidably mounted to a first rail and a second rail attached to the storage cabinet 10 (shown in FIG. 2). The racks 12 slide between a retracted position within the storage cabinet 10 and an extended position substantially outside the cabinet 10. Sliding the racks 12 in and out of the cabinet 10 permits access to electrical/computer components within the racks.

The storage cabinet 10 has a back wall 78 (shown in FIG. 4), a first side wall 14 and a second side wall 16. A front face 18 of the cabinet 10 has a front opening 20 to allow the racks 12 to be slid into and out of the cabinet 10. First and second front side lips 22 and 24 frame the front opening 20 of the cabinet 10. Rack mounts or mounting posts (not shown), as known in the art, are attached to the first and second side walls 14, 16 inside the cabinet 10, preferably adjacent each corner of the cabinet 10. Preferably the first and second slide rails are attached to the rack mounts. In other embodiments, the slide rails may be attached to the first and second front lips 22, 24 inside the cabinet 10 and an inner face of the back wall. A first gap is formed between the first slide rail and the first side wall 14 of the cabinet 10 and a second gap is formed between the second slide rail and the second side wall 16 of the cabinet 10. The first and second gaps are preferably formed by spacing the slide rails from the side walls 14 and 16, in particular, by using the rack mounts to attach the rails or by attaching the rails to either front lip and the back wall of the cabinet 10. The first and second gaps form air channels, which aid in circulating air through and venting air from the cabinet 10. Wall vents (not shown) are formed in the back, side walls 14, 16 and top of the cabinet 10 to allow air to exit to the atmosphere. In addition, a fan (not shown) may be used in the cabinet 10 to circulate air through and out of the cabinet 10.

Each rack 12 includes a front panel 26 attached to a front wall 28 of the rack 12, which is visible through the front opening 20 of the storage cabinet 10. The front panel 26 includes such features as vents 30 to allow air to exit the cabinet 10, handles 32 to more easily slide the racks 12 into and out of the storage cabinet 10 and other types of openings 34 for controls and/or displays associated with electrical/computer components stored within the racks 12.

Figure 2:
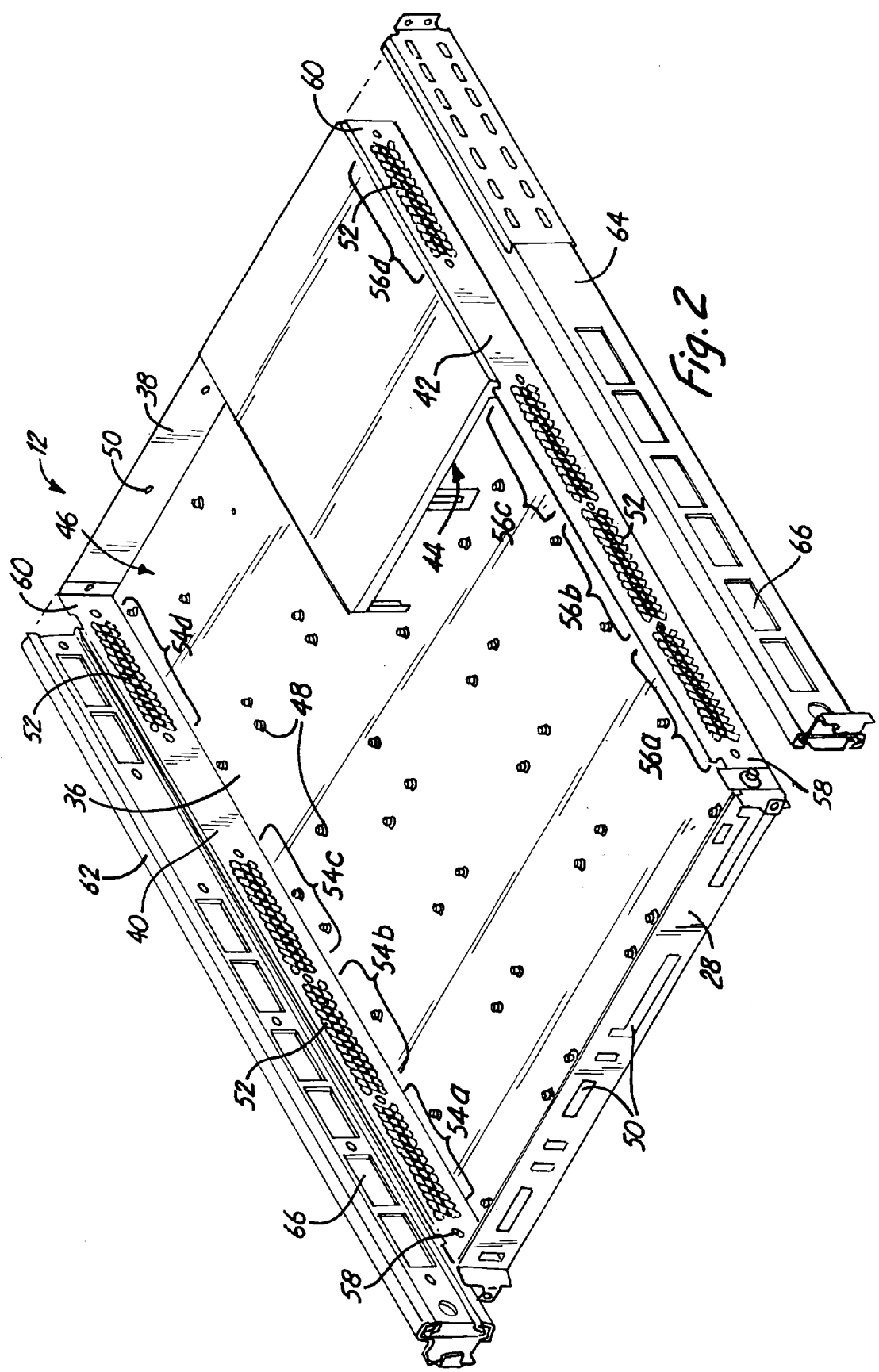
FIG. 2 is a top perspective view of a storage rack and slide rail.

FIG. 2 is a top perspective view of the storage rack 12 (or box) with first and second slide rails 62 and 64 oriented for attachment to the rack 12. The storage rack 12 has a bottom surface 36 and four walls, including the front wall 28, a back wall 38, and first and second side walls 40 and 42. In one embodiment, a length of the rack 12 is greater than a width of the rack 12. In addition, the rack 12 shown in FIG. 2 has a height of about 1 u, or 1.75 inches. Other embodiments of the rack may have a height of 2 u, 3 u, or greater.

Located in one corner of the rack 12, preferably a rear corner, is a compartment 44 for storing one or more power units (not shown). The compartment 44 is separated from a main portion 46 of the box where other electrical components are stored. Other embodiments of the box may not include such a compartment, or may include a compartment having a different size or location. Computer equipment (not shown), such as circuit boards, hard drives, central processing units, disc drives, tape drives, storage arrays and controller card servers are stored in the main compartment 46 of the rack 12. Connection pins 48 located on the bottom surface 36 of the rack 12 are used for attaching the electrical/computer components to the rack 12 within the main compartment 46.

Although not shown in FIG. 2, the rack 12 includes a cover, which is mounted to the back wall 38 of the rack 12. The cover includes a hinge, or other means, for opening and closing the cover and allowing access to the rack 12 when the rack is extended from the storage unit. Openings 50 are formed in the front wall 28 of the rack 12, as well as the back wall 38. The openings 50 are used for controls and/or displays associated with the components stored within the rack 12 and for providing connections to the equipment.

The first and second side walls 40 and 42 include a plurality of openings 52, or vents, formed along each side wall. The vents 52 may have a hexagonal shape, although other shapes and sizes of the vents may be used, such as square, circular, triangular or rectangular. The first side wall 40 has four sections 54a, 54b, 54c and 54d of vents located along the length of each slide rail. The second side wall 42 also includes four vent sections 56a, 56b, 56c and 56d along its length. Although four vent sections are shown in FIG. 2 along each side wall, other embodiments of the rack may include fewer or more vent sections covering more or less area of the side wall. The first and second side walls 40, 42 have a front end 58 and a back end 60. Beginning at the front end 58 of the side walls 40, 42, there are preferably three vent sections (54a–54c, 56a–56c) in series. A single section of vent sections (54d, 56d) are located adjacent the back end 60 of the side walls 40, 42. The groups of vent sections are separated by a portion of the side walls having no openings.

A set of fans (not shown) are preferably attached within the rack 12 and aligned with a forward vent section (54a–54c or 56a–56c). The fans facilitate circulating air from inside the rack 12, through the vents 52, and outside the rack 12 to maintain acceptable temperatures within the rack 12. The air exits the rack 12 and passes through first and second gaps formed between the slide rails and the side walls 14, 16 of the cabinet 10 before exiting the cabinet 10 through vents (not shown) in the back and/or side walls 14, 16 of the cabinet 10.

First slide rail 62 and second slide rail 64 are attached to the first and second side walls 40 and 42 of the rack 12, respectively. The first and second slide rails 62 and 64 also attach to the first and second side walls 14, 16 of the storage cabinet 10, respectively. The slide rails 62, 64 are telescoping and allow the racks 12 to be slid in and out of the storage cabinet 10. Each slide rail 62, 64 includes a plurality of vents 66, or openings, along its length. When the slide rail is attached to a side wall of the rack 12, the vents 66 of the slide rail are aligned with the vent sections (54a–54d, 56a–56d) of the rack 12. As discussed with respect to FIGS. 5A–5C, the telescoping slide rails 62, 64 are comprised of three members. The rail vents 66 are spaced along the slide rails 62, 64 such that when the rack 12 is retracted and when the rack 12 is extended, the rail vents 66 line up with the rack vent sections. The slide rails 62, 64 and rack 12 are preferably made of steel and made by stamping.

Figure 3:
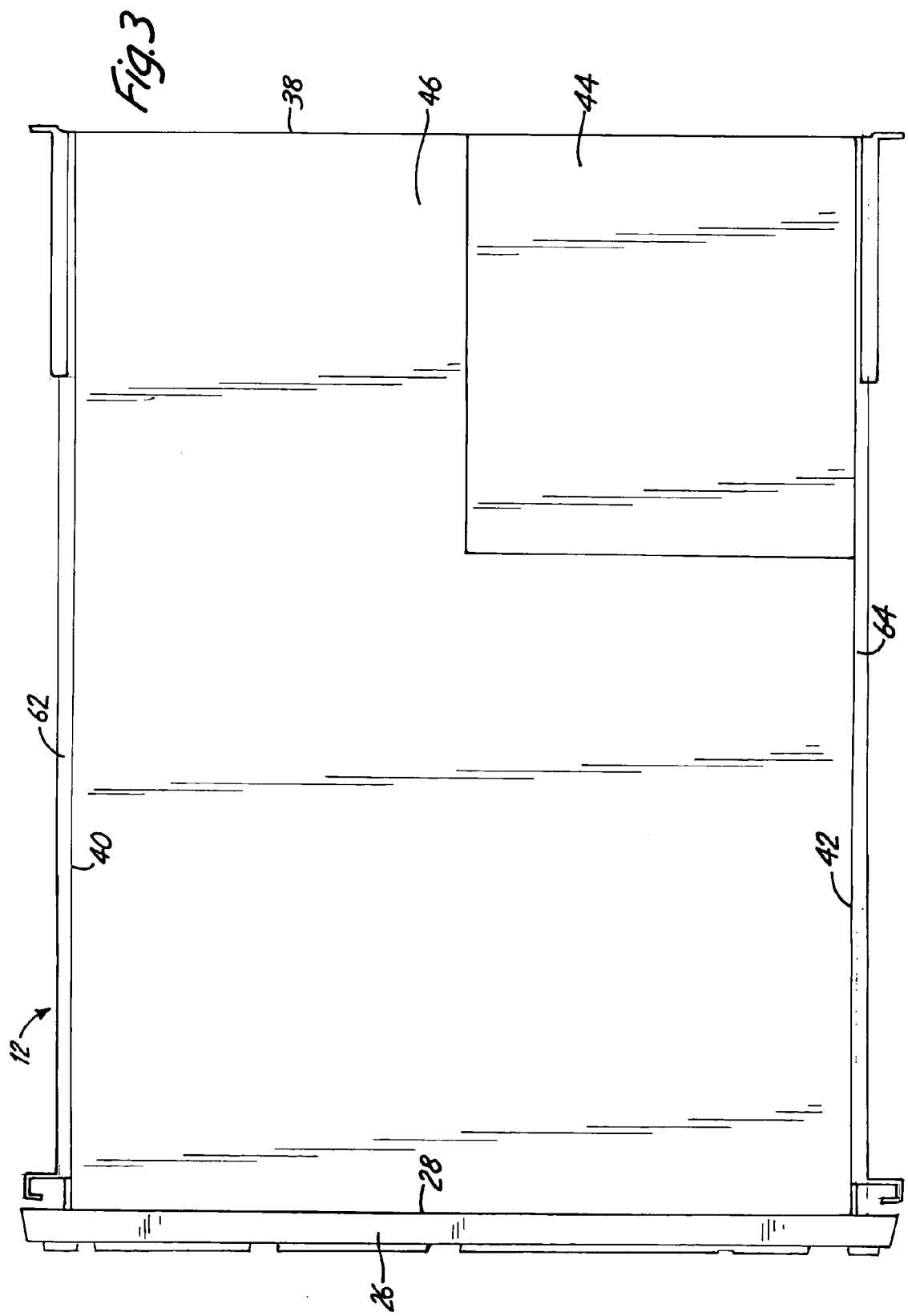
FIG. 3 is a top view of the storage rack in a retracted position.
Figure 4:
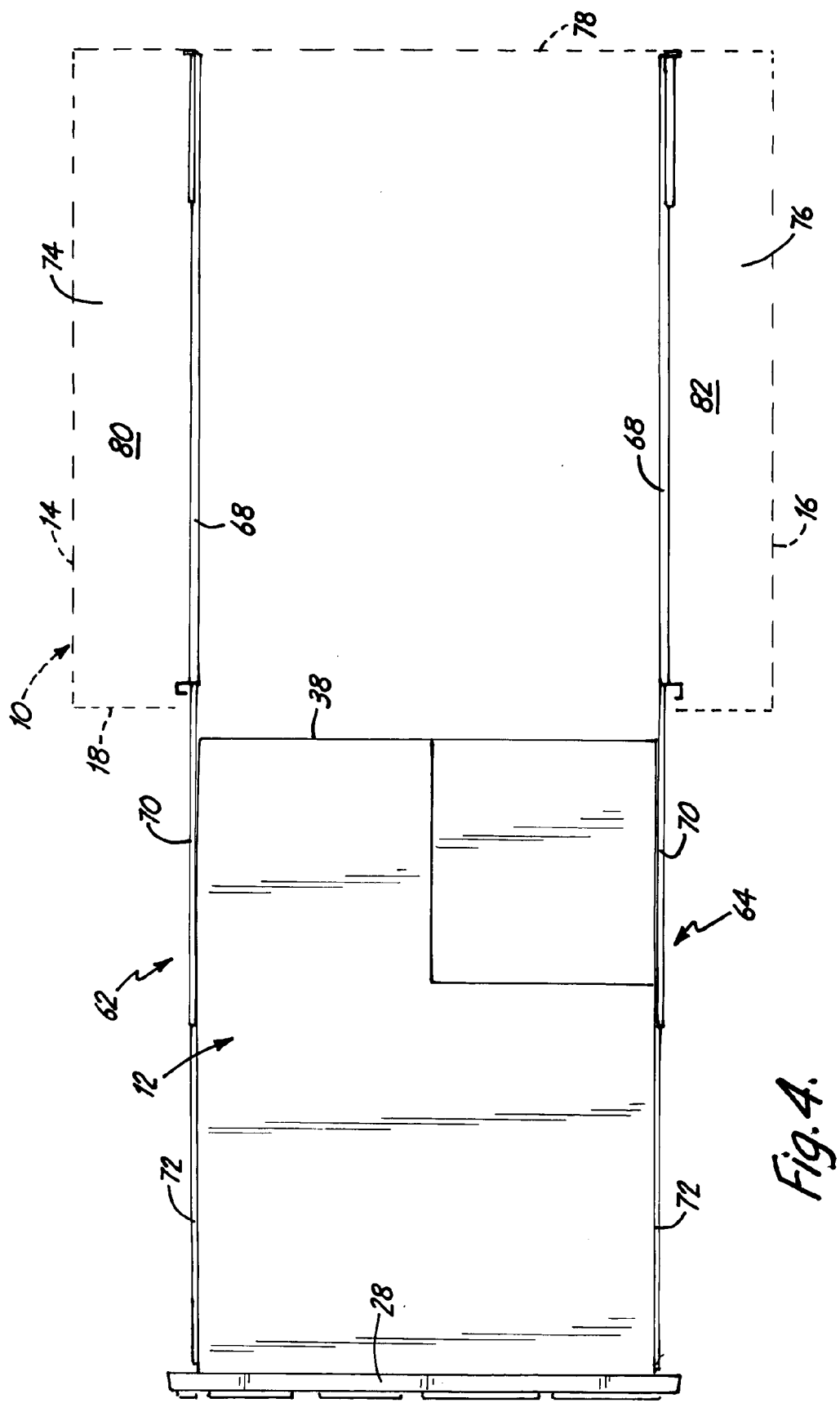
FIG. 4 is a top view of the storage rack in an extended position.

FIG. 3 is a top view of the storage rack 12 in a retracted position and FIG. 4 is a top view of the storage rack 12 in an extended position. The storage rack 12 is slidable between a retracted position and an extended position. The telescoping first and second slides rails 62, 64 attach the rack 12 to the cabinet 10. Each slide rail 62, 64 is preferably comprised of three members, an outer member 68, a center member 70, and an inner member 72. The three rail members 68, 70, 72 are slidably attached to each other. In the retracted position, the rack 12 is located completely within the storage cabinet 10 and the three rail members of the slide rail 62, 64 are parallel and aligned with each other. In the extended position, the rack 12 extends substantially outside the cabinet 10 and the rail members 68, 70, 72 are extended from each other.

A first gap 74 is formed between the first slide rail 62 and the first side wall 14 of the cabinet 10 and a second gap 76 is formed between the second slide rail 64 and the second side wall 16 of the cabinet 10. The first and second gaps 74, 76 are preferably formed by spacing the slide rails 62, 64 from the side walls 14 and 16, in particular by attaching the rails to rack mounts within cabinet 10 or by attaching the rails to either front lip 22, 24 and a back wall 78 of the cabinet 10. The first and second gaps 74, 76 form air channels 80, 82, which aid in circulating air through cabinet 10 and venting air from cabinet 10.

FIG. 5A is a perspective view of the outer rail member 68 of a slide rail. The outer member 68 preferably has a height equal to the height of the storage rack 12. The outer member 68 has a first end 84 and a second end 86. The first end 84 includes a front extension 88 for attaching the outer member 68 of the slide rail to the storage cabinet 10. The front extension 88 extends substantially perpendicularly from the first end 84 of the outer member 68. The front extension 88 is attached to one of the rack mounts (discussed with respect to FIG. 1) located adjacent the front face 18 of the cabinet 10. Holes 90 are located at the second end 86 of the outer member 68 for mounting a mounting bracket (shown in FIG. 6) to the outer member 68.

Openings 92, or vents, are located along the length of the outer member 68. The vents 92 are rectangular shape, however, other embodiments of the rail member 68 may include vents 92 having other shapes or sizes. The openings 92 form four vent sections 94a, 94b, 94c and 94d along the length of the outer member 68. In FIG. 5A, each vent section is comprised of two openings. The spacing of the outer member vent sections 94a–94d correlates with the spacing of the storage rack vent sections 54a-54d, 56a-56d (shown in FIG. 2). For example, in FIG. 5A, three vent sections 94a, 94b, 94c are located adjacent the first end 84 of the outer member 68 and the final vent section 94d is located adjacent the second end 86 of the outer member 68.

The outer member 68 has an upper edge 96 and a lower edge 98. The upper and lower edges 96, 98 are bent towards a longitudinal centerline 100 of the outer member 68 to form an upper track 102 and a lower track 104. The upper track 102 and the lower track 104 lie substantially parallel to the outer member 68. The upper and lower tracks 102, 104 are used to slidably attach the center member 70 to the outer member 68, such that center member 70 slides longitudinally within the tracks 102, 104.

FIG. 6 is a perspective view of a mounting bracket 106 for attaching the slide rail to the storage cabinet 10. The mounting bracket 106 is attached to the mounting holes 90 located at the second end 86 of the outer member 68. The mounting bracket 106 may be attached to the second end 86 of the outer member 68 at any point to lengthen the slide rail 62, 64. The use of the mounting bracket 106 to lengthen the slide rail is necessary because the depth of storage cabinets varies, and thus, a standard size slide rail can be used in various sized cabinets. The mounting bracket 106 includes a rear extension 108 that projects substantially perpendicularly away from a base 110 of the mounting bracket 106. The base 110 of the mounting bracket 106 is attached to the second end 86 of the outer member 68. The rear extension 108 is used to attach the slide rail to one of the rack mounts located adjacent the back wall 78 of the storage cabinet 10. The mounting bracket 106 includes openings 112 for mounting the bracket 106 to the outer member 68. In addition, the openings 112 align with the rear vent section 94d to facilitate venting of air from the storage rack 12.

FIG. 5B is a perspective view of the center rail member 70 of a slide rail. The center member 70 is elongated and has a first end 114 and a second end 116. The center member 70 also has an upper edge 118 and a lower edge 120. The upper and lower edges 118, 120 of the center member 70 are bent towards a longitudinal centerline 122 of the center member 70 to form an upper track 124 and a lower track 126. The upper and lower tracks 124, 126 lie substantially parallel to the center member 122 and slidably receive the inner rail member 72. The upper and lower tracks 124, 126 form an upper outer corner 128 and a lower outer corner 130, respectively, which are received by the upper and lower tracks 102, 104 of the outer member 68. The upper and lower tracks 102, 104 of the outer member 68 receive the upper and lower outer corners 128, 130 such that the center member 70 slides longitudinally within the upper and lower tracks 102, 104 of the outer member 68.

The center member 70 includes openings 132, or vents, located along the length of the center member 70. The vents 132 are divided into vent sections 134a, 134b, 134c and 134d which correspond to the vent sections of outer member 68 and the side walls 40, 42 of the storage rack. Preferably, there are four vent sections, with each vent section being comprised of two openings 132. Three vent sections 134a, 134b, 134c are located along the center member 70 starting at the first end 114 of the center member 70. The fourth vent section 134d is located at the second end 116 of the center member 70. The spacing of the center member vent sections 134a–134d correlates with the spacing and location of the outer member vent sections 94a–94d and the rack vent sections 54a–54d, 56a–56d. Thus, when the rack 12 is in the retracted position or is partially extended, the center member vent sections 134a–134d are aligned with the vent sections of the outer member 68 and the rack 12 to enable circulation of air from the rack 12.

FIG. 5C is a perspective view of the inner rail member 72 of a slide rail. The inner member 72 is elongated and has a first end 136 and a second end 138. The inner member 72 is substantially flat and has an upper edge 140 and a lower edge 142. The upper edge 140 and the lower edge 142 form an upper rail 144 and a lower rail 146, respectively, for being slidably received by the upper and lower tracks 124, 126 of the center member 70. As seen in FIG. 5C, the upper edge 140 and the lower edge 142 may be bent or lie in a plane substantially parallel to the plane of the inner rail member 72 to form the upper and lower rails 144, 146.

The inner rail member 72 has openings 148, or vents, extending along its length. The vents 148 are grouped into vent sections 150a, 150b, 150c and 150d that correspond to the vent sections of the center member 70, the outer member 68 and the side walls 40, 42 of the storage rack 12. Three vent sections 150a, 150b, 150c are located along the inner member 72 starting at the first end 136 and the fourth vent section 150d is located at the second end 138 of the inner member 72. Each inner member vent section is preferably comprised of two openings 148. Mounting holes 152 are formed in the inner member 72 for mounting the inner member 72 of the slide rail to a side wall of the storage rack 12. The slide rails 62, 64 are preferably attached to the rack 12 using hardware, such as bolts, screws, or rivets. When the inner member 72 is attached to the side wall of the storage rack 12, the vent sections 150a–150d of the inner member 72 are aligned with the storage rack vent sections 54a–54d, 56a–56d.

FIG. 7 is a perspective view of the slide rail 62 in the extended position and FIG. 8 is a perspective view of the slide rail 62 in the retracted position. The slide rail 62 is comprised of the outer 68, center 70 and inner 72 rail members. The inner member 72 is slidably received within the upper and lower tracks 124, 126 of the center member 68 and the center member 68 is slidably received within the upper and lower tracks 102, 104 of the outer member 68.

When the storage rack 12 is in the retracted position, the rack 12 lies within the storage cabinet 10 and the slide rails 62, 64 are in the retracted position. In the retracted position, the inner member 72 is slid fully into the center member 70 and the center member 70 is slid fully into the outer member 68. The vent sections of the outer 68, center 70 and inner 72 rail members are all substantially aligned with each other and with the rack vent sections 54*a*–54*d*, 56*a*–56*d* such that there is a clear air passage between the main compartment 46 of the rack 12 and the first and second gaps 74, 76 of the storage cabinet 10.

The electrical/computer components stored within the rack 12 produce heat which can increase the temperature within the rack 12 to unacceptable levels if not dissipated. Temperatures between about 104° F. to about 122° F. are too high and are considered unacceptable. To maintain an acceptable temperature level within the storage rack 12, the side vents 52, 66 of the rack 12 and rails 62, 64 are utilized to exhaust the heated air out of the storage rack 12 and into the first and second gaps 74, 76 formed between the slide rails 62, 64 and the storage cabinet side walls 14, 16. The air circulates through the cabinet 10 and exits the cabinet 10 through vents located in the back wall 78, side walls 14, 16 or top of the cabinet 10. Fans may be used to facilitate the movement of heat out of the rack 12 and a fan may be used to blow air through the air channels 80, 82 and out of the cabinet 10. Testing has shown that with vents 52, 66 in the side walls 40, 42 of the rack 12 and in the slide rails 62, 64, and the use of one set of fans within the rack is sufficient to maintain acceptable temperatures within the storage rack 12.

In addition, the use of slide rails 62, 64 with the vents 66 allows close stacking of the storage racks 12 within the storage cabinet 10, which maximizes the amount of space utilized within the cabinet 10. The storage racks 12 are vertically stacked immediately adjacent each other within the cabinet 10, with substantially no gap in between each rack 12, and thus more racks 12 may be stored in the cabinet 10 than with prior art cabinets. To access the components within the storage racks 12, the rack 12 is pulled outward from the storage cabinet 10 and the slide rails 62, 64 are extended until the storage rack 12 is in the extended position substantially outside of the storage cabinet 10. In a preferred embodiment of the storage system, the slide rails 62, 64 and the storage rack 12, mounted to the slide rails, are substantially the same height. Furthermore, the vents 66 of the slide rails 62, 64 are aligned with the vent sections 54*a*-54*d*, 56*a*-56*d* of the storage rack 12 to facilitate better venting of the storage rack 12.

To move the storage rack 12 into the extended position, the rack 12 is pulled forward out of the cabinet 10 and the slide rails 62, 64 are moved into the extended position. The second end 116 of the center member 70 moves longitudinally forward towards the first end 84 of the outer member 68. A locking mechanism (not shown) locks the center member 70 and the outer member 68 adjacent the second end 116 of the center member 70 and the first end 84 of the outer member 68 together to keep the center member 70 from being disconnected from the outer member 68. The second end 138 of the inner member 72 moves longitudinally forward towards the first end 114 of the center member 70. A locking mechanism (not shown) locks the inner member 72 and center member 70 together in the extended position to prevent the inner member 72 from being disconnected from the center member 70.

The present invention relates to a storage system for storing electrical equipment. The storage system includes a cabinet having a first side wall, a second side wall and a front opening at a front face of the cabinet. A rack having a back wall, a front wall, a top wall, a bottom wall and first and second side walls is mounted within the cabinet. The first side wall has at least one opening and the second side wall has at least one opening wherein the first and second side walls of the rack define a height of the rack. The system includes a first telescoping slide rail having a first member and a second member wherein the first member is connected to and spaced apart from the first side wall of the cabinet and the second member is connected to the first side wall of the rack. The first slide rail has at least one opening wherein the first slide rail has a height substantially equal to the height of the rack. The system further includes a second telescoping slide rail having a first member and a second member wherein the first member is connected to and spaced apart from the second side wall of the cabinet and the second member is connected to the second side wall of the rack. The second slide rail has at least one opening wherein the second slide rail has a height substantially equal to the height of the rack. The openings of the first and second slide rails are aligned with the openings of the first and second side walls of the rack.

Another embodiment of the present invention is a storage rack for storing electrical equipment. The storage rack is slidably mounted to a slide rail within a storage cabinet. The rack includes a box having a bottom and a front wall, a back wall and first and second side walls. The first and second side walls define a height of the box. A plurality of first openings are located in the first side wall and a plurality of second openings are located in the second side wall. First mounting points on the first side wall mount a first slide rail to the rack and the first slide rail has a height equal to the height of the first side wall. Second mounting points on the second side wall mount a second slide rail to the rack and the second slide rail has a height equal to the height of the second side wall.

In a further embodiment, the present invention is a slide rail for slidably mounting a storage rack within a storage cabinet wherein the slide rail and the storage rack have approximately the same height. The rail includes three elongated rail members. A first elongated member has a plurality of openings and mounting points, the mounting points are used for attaching the first member to an inside wall of the storage cabinet. A second elongated member slidably attaches to the first member. The second member has a plurality of second openings. The second member is slidable between a first position such that the second member is substantially retracted into the first member and a second position such that the second member is substantially extended from the first member. A third elongated member slidably attaches to a second member, the third member having a plurality of openings and mounting points, the mounting points for attaching the third member to the storage rack. The third member is slidable between a first position such that the third member is substantially retracted into the second member and a second position such that the third member is substantially extended from the second member.

The inventive slide rails, storage rack and cabinet allow improved venting of the storage racks to maintain acceptable temperature levels within the rack and allow close vertical stacking of the storage racks within the cabinet. The racks and the slide rails are substantially the same height to allow close vertical stacking. In addition, each side wall of the rack and the slide rails attached thereto have aligned openings to facilitate venting of the air from the storage racks and maintain an acceptable temperature level. Gaps are formed between each slide rail attached to the rack and the cabinet side walls to channel air and circulate air through and out of the cabinet.

Although the present invention has been described with reference to preferred embodiments, workers skilled in the art will recognize that changes may be made in form and detail without departing from the spirit and scope of the invention. For example, the vent openings in both the rack and the slide rails may be any shape, including circular, square, rectangular or hexagonal, and many sizes. In addition, fewer or more rail members may be used for the slide rails.

What is claimed is:

1. A slide rail for slidably mounting a storage rack within a storage cabinet wherein the slide rail and the storage rack have approximately the same height, the rail comprising:
   a first elongated member having a plurality of first vents and mounting points, the mounting points for attaching the first member to an inside wall of the storage cabinet;
   a second elongated member slidably attached to the first member, the second member having a plurality of second vents wherein the second member is slidable between a first position such that the second member is substantially retracted into the first member with a plurality of second vents generally aligned with the plurality of first vents and a second position such that the second member is substantially extended from the first member; and
   a third elongated member slidably attached to a second member, the third member having a plurality of third vents and mounting points, the mounting points for attaching the third member to the storage rack wherein the third member is slidable between a first position such that the third member is substantially retracted into the second member with a plurality of third vents generally aligned with the plurality of first and second vents and a second position such that the third member is substantially extended from the second member.

2. The slide rail of claim 1, and further comprising a mounting bracket attached to the mounting points of the first member wherein the mounting bracket is attached to the inside wall of the storage cabinet.

3. The slide rail of claim 1, the first member further comprising a first track and a second track wherein the second member slides within the first and second tracks of the first member.

4. The slide rail of claim 1, the second member further comprising a first track and a second track wherein the third member slides within the first and second tracks of the second member.

5. The slide rail of claim 1, wherein the plurality of first, second and third vents extend along a length of the first, second and third members, respectively.

* * * * *

UNITED STATES PATENT AND TRADEMARK OFFICE
CERTIFICATE OF CORRECTION

PATENT NO. : 6,893,091 B1
APPLICATION NO. : 10/414906
DATED : May 17, 2005
INVENTOR(S) : Martin Fenner Page 1 of 1

It is certified that error appears in the above-identified patent and that said Letters Patent is hereby corrected as shown below:

On Title Page under References Cited after
4,370,007 A * 1/1983 Fler delete "312/334.1" and
insert --312/334.11--

Signed and Sealed this

Fifteenth Day of August, 2006

JON W. DUDAS
*Director of the United States Patent and Trademark Office*